United States Patent
Kim et al.

[11] Patent Number: 5,770,866
[45] Date of Patent: Jun. 23, 1998

[54] RESONANT TUNNELING ELECTRONIC DEVICE

[75] Inventors: Gyung-Ock Kim, Yusong-ku; Dong-Wan Roh, Seo-ku; Seung-Won Paek, Chungju, all of Rep. of Korea

[73] Assignee: Electronics and Telecommunicatios Research Institute, Daejeon, Rep. of Korea

[21] Appl. No.: 736,213

[22] Filed: Oct. 25, 1996

[30] Foreign Application Priority Data

Dec. 21, 1995 [KR] Rep. of Korea .................. 1995-53647

[51] Int. Cl.[6] .......................... H01L 29/06; H01L 29/15; H01L 29/88
[52] U.S. Cl. .......................................................... 257/25
[58] Field of Search .................................. 257/17, 22, 25

[56] References Cited

U.S. PATENT DOCUMENTS

| | | | |
|---|---|---|---|
| 4,620,206 | 10/1986 | Ohta et al. | 257/17 |
| 4,878,104 | 10/1989 | Reed et al. | 257/17 |
| 4,914,488 | 4/1990 | Yamane et al. | 257/17 |

OTHER PUBLICATIONS

Resonant tunneling through a $HgTe/Hg_{1-x}Cd_x Te$ double barrier, single quantum well heterostructure; M.A. Reed, R.J. Koestner, and M.W. Goodwin; accepted for publication 10 Sep. 1986; pp. 1293–1295.

Oscillations up to 712 GHz in InAs/AlSb resonant–tunneling diodes; E.R. Brown, J.R. Soderstrom, C.D. Parker, L.J. Mahoney, K.M. Molvar and T.C. McGill; 8 Oct. 1990; accepted for publication 18 Mar. 1991; pp. 2291–2293.

Fabrication of High–Performance $Al_xGa_{1-x}As/In_yGa_{1-y}As$ Resonant Tunneling Diodes Using a Microwave–Compatible Technology; D. Lippens, E. Barbier, and P. Mounaix; Mar. 1991; pp. 114–116.

AlGaAs/Ga–As double barrier diodes with high peak–to–valley current ratio; C.I. Huang, M.J. Paulus, C.A. Bozada, S.C. Dudley, K.R. Evans, C.E. Stutz, R.L. Jones and M.E. Cheney; 1987; accepted for publication 13 May 1987; pp. 121–123.

The design of GaAs/AlAs resonant tunneling diodes with peak current densities over $2 \times 10^5$ A $cm^{-2}$; E. Wolak, E. Ozbay, B.G. Park, S.K. Diamond, David M. Bloom and James S. Harris, Jr.; accepted for publication 26 Nov. 1990; pp. 3345–3350.

Quantum well oscillators; T.C.L.G. Sollner, P.E. Tannenwald, D.D. Peck, and W.D. Goodhue; accepted for publication 25 Sep. 1984; pp. 1319–1321.

*Primary Examiner*—Jerome Jackson
*Assistant Examiner*—John Guay
*Attorney, Agent, or Firm*—Antonelli, Terry, Stout & Kraus, LLP

[57] ABSTRACT

The present invention provides a resonant tunneling electronic device having a plurality of nearly decoupled quantum barrier layers and quantum-well layers alternatively formed between an emitter layer and a collector layer, and has a stacked structure in such a manner that in the order of their stack the heights of the quantum barriers are gradually increased, and the widths of the quantum-wells interposed between the quantum barrier layers are gradually decreased, so that electron resonant tunneling through the aligned quantum with confined states under the application of external bias can occur.

4 Claims, 4 Drawing Sheets

RESONANT TUNNELING ELECTRONIC DEVICE

FIELD OF THE INVENTION

The present invention relates to a resonant tunneling electronic device having quantum-well heterostructures, and more particularly, to a resonant tunneling electronic device which is capable of increasing a peak-to-valley ratio (hereinafter, referred to as "PVR"), to thereby enhance the performance of a switching device and a logic device.

BACKGROUND OF THE INVENTION

Recently, several semiconductor devices which utilize semiconductor heterostructures have been developed based on the semiconductor growth techniques such as MBE and MOCVD. Accordingly, studies of a resonant tunneling effect through the quantum-confined states of electrons occurring in a quantum-well structure due to a band line-up in the heterostructures such as GaAs/AlAs, GaAs/GaAlAs, InAs/GaSb, InAs/ZnTe and such like have been performed.

In the case of using such resonant tunneling effect, elements are possible to operate at a high speed tera transmission and level. In particular, NDR (Negative Differential Resistance) characteristics of a current according to the resonant tunneling have application to an ultra-high speed switching device, a microwave device and a logic device because of a high speed switching time and a low power consumption.

Accordingly, in the semiconductor devices having these NDR characteristics, the achievement of a high peak current and a high PVR is an important factor in order to improve the performance of elements.

As a conventional technique, one example of the electronic device which utilizes the quantum-well is disclosed in Appl. Phys., Lett. Vol. 45, No. 12, p1319–1321. December 1984, "Quantum well oscillators".

As shown in FIG. 1, a layer structure in the above device is formed on an n$^+$GaAs substrate by the molecular beam epitaxy ("MBE") technique.

In this structure, a GaAs thin layer 14 is interposed between a first $Ga_{0.7}Al_{0.3}As$ thin film layer 12 and a second $Ga_{0.7}Al_{0.3}As$ thin film layer 16, and a GaAs layer 18 is formed on the second $Ga_{0.7}Al_{0.3}As$ thin film layer 16. By adding aluminum to both of the first and the second $Ga_{0.7}Al_{0.3}As$ thin film layers 12, 16, a height of band gap thereof is higher than that of the GaAs thin layer 14, resulting in a region which functions as a transparent mirror for electrons, thereby allowing an electric charge to tunnel through a barrier with the thickness of 50 Å.

Thus, two mirrors are formed on a sort of Fabry-Perot having a peak as an incident energy during the transmission of electrons. This energy corresponds to the confined energy state of the quantum well structure.

The prior art quantum well oscillators with the structure described are able to act as a high frequency source under low power.

In the prior art electronic device, however, since a width and a height between the quantum-well and the quantum barrier are similar to each other, for-example, since these are formed having the same height, it has a drawback that it is difficult to control the reduction of peak current and further to increase a barrier effect.

SUMMARY OF THE INVENTION

An object of the present invention is to provide a resonant tunneling electronic device which is capable of increasing a peak current by resonant tunneling effect through the alignment of quantum-confined states of nearly decoupled quantum wells according to stark shift and decreasing a valley current by controlling a height of effective barrier, resulting in the increasing of the peak-to-valley ratio, thereby improving the performance of a switching device and a logic device.

According to one aspect of the present invention, a resonant tunneling electronic device comprises a plurality of nearly decoupled quantum barrier layers and quantum-well layers alternatively formed between an emitter layer and a collector layer, wherein the resonant tunneling electronic device has a stacked structure in such a manner that an effective barrier height of the quantum barrier formed in the direction from the emitter layer to the collector layer is gradually increased, and a width of the quantum-well interposed between the quantum barrier is gradually decreased, so that electron resonant tunneling can occur through the aligned quantum-well confined states under the application of external bias.

According to the other aspect of the present invention, a resonant tunneling electronic device comprises a plurality of nearly quantum barrier layers and quantum-well layers alternatively formed between an emitter layer and a collector layer, wherein the device has an asymmetrically combined structure such that a width of the quantum-well providing quantum-confined states is gradually decreased and a height of the quantum barrier is gradually increased.

DETAILED DESCRIPTION OF THE PREFERRED EMBODIMENTS

The above and other objects and features of the present invention will become apparent from the following description of preferred embodiments, when taken in conjunction with the accompanying drawings.

Figure 1:
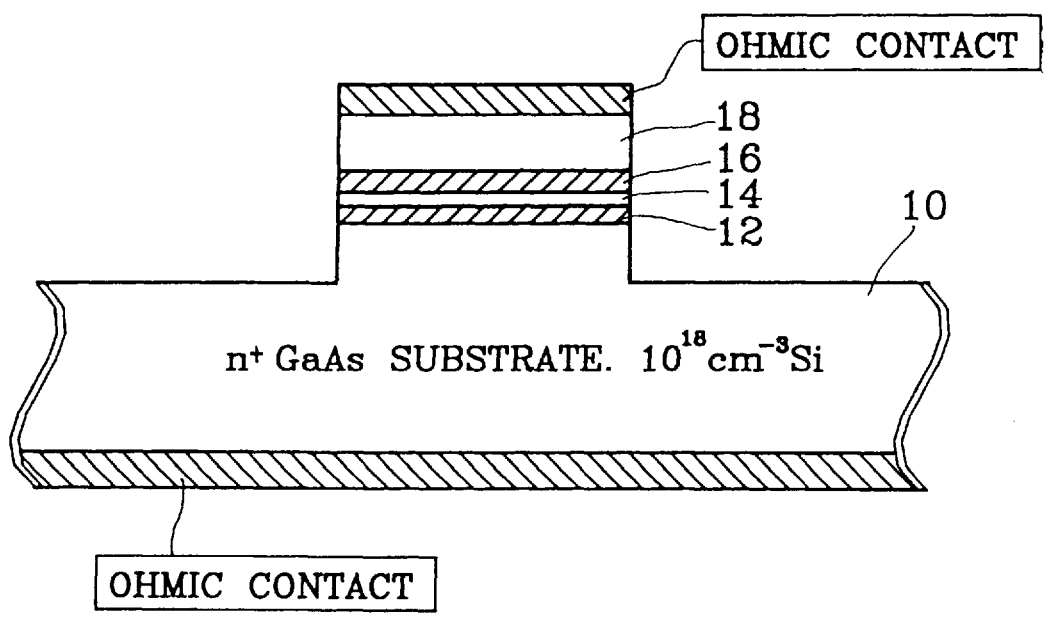
FIG. 1 is a cross sectional view showing the conventional electronic device.
Figure 2:
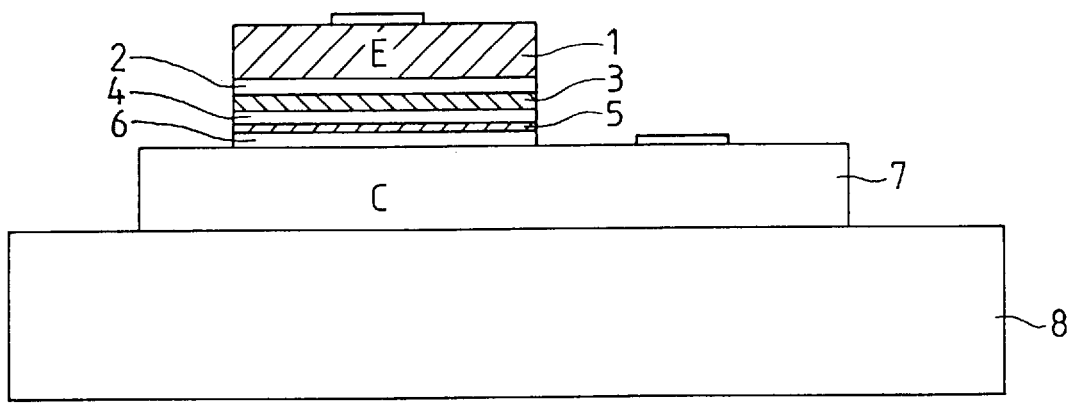
FIG. 2 is a cross sectional view of a resonant tunneling electronic device in accordance with the present invention.

FIG. 2 is a cross sectional view of an inventive resonant tunneling electronic device in accordance with the present invention.

As shown in FIG. 2, the resonant tunneling electronic device of the present invention comprises a conductive emitter layer 1, a first quantum barrier layer 2, a first quantum-well layer 3, a second quantum barrier layer 4, a second quantum-well layer 5, a third quantum barrier layer 6, a conductive collector layer 7 and a substrate 8.

The resonant tunneling electronic device according to the first embodiment of the present invention having a stacked structure which comprises a plurality of quantum barrier layers 2, 4, 6 and quantum-well layers 3, 5 alternatively formed between an emitter layer 1 and a collector layer 7 in such a manner that the effective barrier heights of the quantum barriers formed in the direction from the emitter layer 1 to the collector layer 7 are gradually increased, and the widths of the quantum-wells interposed between the quantum barrier layers 2, 4, 6 are gradually decreased.

The resonant tunneling electronic device according to the second embodiment of the present invention having a stacked structure which comprises a plurality of nearly coupled quantum barrier layers 2, 4, 6 and quantum-well layers 3, 5 alternatively formed between an emitter layer 1 and a collector layer 7.

That is, the resonant tunneling electronic devices having the above mentioned structure which is constituted by an asymmetrical combined structure such that a width of the quantum-well providing quantum-confined states in quantum-well structures over two(quantum barrier structures of three and over) is gradually decreased and a height of the quantum barrier is gradually increased.

Accordingly, a quantum-confined states for an electron of nearly decoupled quantum wells may be aligned when an external bias is applied thereto, and it is capable of increasing the resonant tunneling effect in the aligned states when a resonant voltage is applied thereto, thereby a peak current is incresed.

Furthermore, in comparing the symmetrical double barrier resonant tunneling structures of the invention with previously disclosed structures, the high effective barrier height and the wider effective width of the quantum barrier and quantum well of the invention make it possible to drop a valley current when an off-resonant voltage is applied thereto.

Figure 3A:
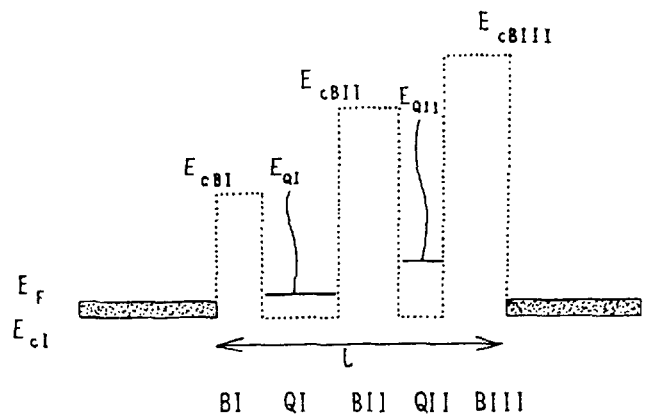
FIGS. 3A to 3C a energy band diagrams illustrating a minimum of conduction band and a maximum of balance band in each layers under each voltage applied thereto, respectively.
Figure 3B:
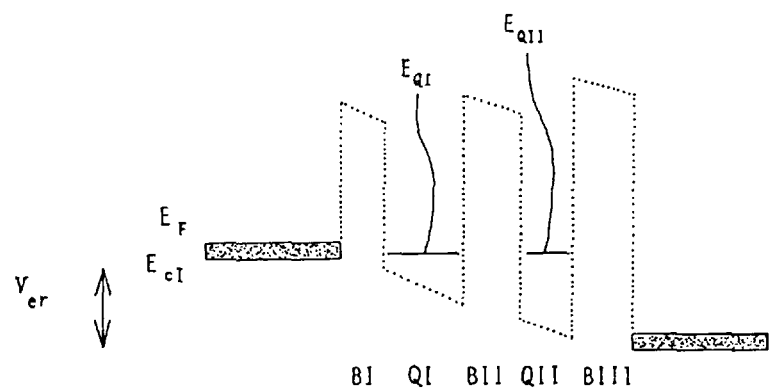
Figure 3C:
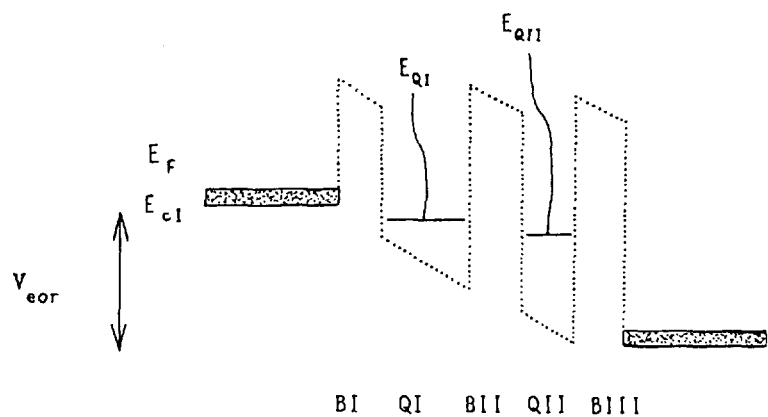

Referring to FIGS. 3A to 3C, there is shown a band diagram representing an energy band diagram which is illustrating the minimum of a conduction band in each layer under each voltage, respectively.

In FIGS. 3A to 3C, $E_F$ denotes a Fermi level; $E_{CI}$, $E_{CBI}$, $E_{CBII}$ and $E_{CBIII}$ indicate the minimum values of the emitter conduction band, the first quantum barrier layer, the second quantum barrier layer and the third quantum barrier layer, respectively; and $E_{CII}$, $E_{QI}$, and $E_{QII}$ illustrate the minimum of the conduction band of the quantum well, a quantum-confined state in the first quantum-well and a quantum-confined state in the second quantum-well, respectively.

Referring to FIG. 3B, the quantum-confined states of electrons of nearly decoupled quantum wells are aligned and the resonant tunneling occurring under the condition of the applied resonant tunneling voltage $V_{er}$ of electrons.

Referring to FIG. 3C, there is shown an energy band diagram when an off-resonant tunneling voltage $V_{eor}$ is applied to the resonant tunneling electronic device, thereby a valley current is lowered.

In the resonant tunneling electronic device of the present invention having the aforementioned energy band, the relationship between the resonant voltage $V_{er}$ and the aligned quantum levels of nearly decoupled quantum wells during the operation of the resonant tunneling electronic device may be defined by the following equation.

$$E_{QI} + V_{er}\frac{2L - 2L_{BI} - L_{QI}}{2L} \cong E_{QII} + V_{eor}\frac{2L_{BIII} + L_{QII}}{2L}$$

wherein, $E_{QI}$ and $E_{QII}$ respectively represent a quantum-confined state in the first and second quantum-well of the electron; $L_{QI}$ and $L_{QII}$ respectively indicate the widths of the first and second quantum-well layers; $L_{BI}$, $L_{BII}$ and $L_{BIII}$ respectively represent the widths of the first, second and third quantum barrier layers; and, $V_{er}$ indicates a resonant tunneling voltage; and $V_{eor}$ indicates an off-resonant tunneling voltage.

In comparing the symmetrical double barrier resonant tunneling structure of the invention with previously disclosed structures, during application of the off-resonant tunneling voltage $V_{eor}$ to the device, the reduction of a height of the barrier occurred by the voltage drop is compensated to increase an effective barrier height, to thereby make it possible to drop a valley current.

As seen in the FIG. 2, the quantum - confined state can be controlled by the width of quantum wells and the height of each quantum barrier.

In addition, an undoped spacer layer for buffering the variation of the level may be formed between the emitter layer 1 and the collector layer 7.

Figure 4A:
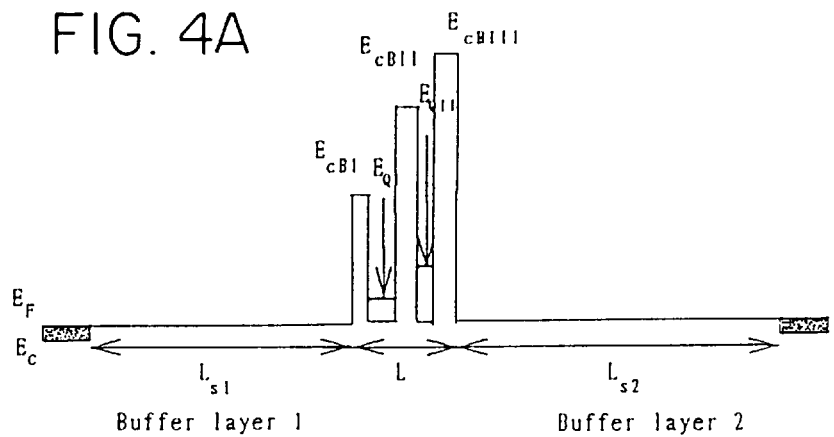
FIGS. 4A–4C are energy band diagrams illustrating the minimum of conduction band in each layer, including buffer layers, under respective voltages.
Figure 4B:
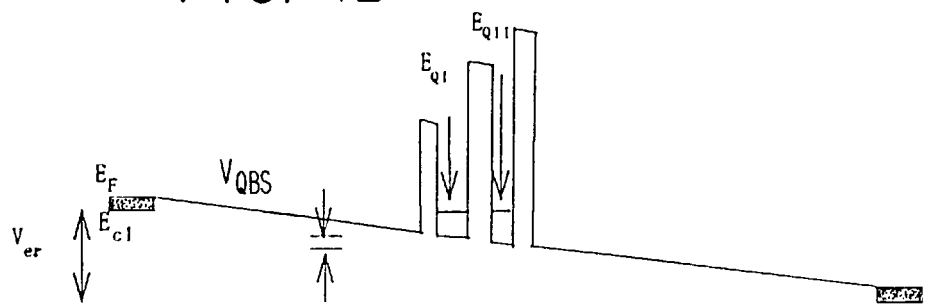
Figure 4C:
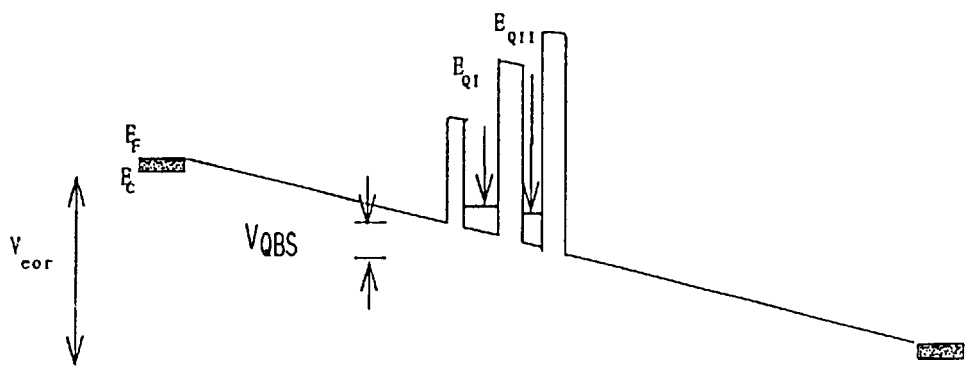

Referring to FIGS. 4A to 4C, there is an energy band diagram which illustrates the minimum of a conduction band and each layer including buffer layers under each voltage, respectively. Each buffer layer $L_{S1}$ and $L_{S2}$ is disposed between the emitter layer and the quantum barrier layer and between the barrier layer and the collector layer. FIG. 4A shows a band diagram under no applied voltage. FIG. 4B shows the quantum-confined states of nearly decoupled quantum wells of electrons which are aligned as well as the resonant-tunneling which occurs under the condition of the applied resonant tunneling voltage $V_{er}$ of electrons. Due to the buffer layer $L_{S1}$ and $L_2$, the actual voltage difference $V_{QBS}$ is applied to the quantum-barrier and quantum-well structures. Since the number of the quantum confined state is increased when more than three quantum-wells are used to the resonant tunneling electronic device, it is possible to provide the variety thereof.

Using an asymmetric combination formed by the quantum-well and the Stark effect, in other words, various multi-level combinations of nearly decoupled quantum wells can be aligned.

As explained above, the invention provides a resonant tunneling electronic device which is capable of increasing a peak current, and increasing a height of an effective barrier to reduce a valley current, resulting in a improved PVR, thereby enhancing the performance of a high-speed logic device and a switching device.

Furthermore, the invention provides a resonant tunneling electronic device which is capable of adaptively tailoring its structure in response to the variation of resonant tunneling structure, specifically a position, a quantum-well and a quantum level depending on the selection of heterojunction materials, and the number of quantum-well level.

Therefore, the invention provides a resonant tunneling electronic device which is capable of controlling the alignment of quantum confined levels of nearly decoupled quantum wells, resulting in the formation of multi-peaks, thereby entailing a reduced number of logic elements incorporated in device.

While the present invention has been described with respect to certain preferred embodiments only, other modifications and variations may be made without departing from the scope of the present invention as set forth in the following claims.

What is claimed is:

1. A resonant tunneling electronic device, comprising:

a plurality of nearly decoupled quantum barrier layers; and a plurality of quantum-well layers disposed alternately with said plurality of nearly decoupled quantum barrier layers between an emitter layer and a collector layer, wherein the resonant tunneling electronic device has a stacked structure in such a manner that an effective barrier height of the quantum barrier formed in the direction from the emitter layer to the collector layer gradually increases, and a width of the quantum-well interposed between the quantum barrier gradually decreases, so that electron resonant tunneling through the aligned quantum well confined states under external bias can occur.

2. The device as claimed in claim 1, further comprising a buffer layer for buffering the variation of the potential drop which is disposed between the quantum barrier layer and the emitter layer or the collector layer.

3. A resonant tunneling electronic device, comprising:

a plurality of nearly decoupled quantum barrier layers; and quantum-well layers disposed between an emitter layer and a collector layer, wherein the device has an asymmetrical combined structure such that a width of the quantum-well providing quantum-confined states gradually decreases and a height of the quantum barrier gradually increases, so that electron resonant tunneling through the aligned quantum-well confined states under external bias can occur.

4. The device as claimed in claim 3, further comprising a buffer layer for buffering the potential drop which is disposed between the quantum barrier layer and the emitter layer or the collector layer.

* * * * *